United States Patent
Rajaee et al.

(10) Patent No.: US 9,197,198 B2
(45) Date of Patent: Nov. 24, 2015

(54) LATCH COMPARATOR CIRCUITS AND METHODS

(71) Applicant: QUALCOMM Incorporated, San Diego, CA (US)

(72) Inventors: Omid Rajaee, San Diego, CA (US); Dinesh J Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/065,854

(22) Filed: Oct. 29, 2013

(65) Prior Publication Data

US 2015/0116020 A1    Apr. 30, 2015

(51) Int. Cl.
H03K 5/22    (2006.01)
H03K 3/037    (2006.01)
H03K 3/356    (2006.01)

(52) U.S. Cl.
CPC ........ *H03K 3/0375* (2013.01); *H03K 3/356034* (2013.01); *H03K 3/356069* (2013.01)

(58) Field of Classification Search
CPC ... H03K 5/2481; H03K 3/0375; G11C 7/065; G01R 19/00
USPC ...................................... 327/50–97
See application file for complete search history.

(56) References Cited

U.S. PATENT DOCUMENTS

| | | | |
|---|---|---|---|
| 4,412,143 A | 10/1983 | Patella et al. | |
| 7,116,588 B2 * | 10/2006 | Joo | 365/189.09 |
| 7,411,420 B2 | 8/2008 | Doi | |
| 7,868,663 B2 * | 1/2011 | Oh et al. | 327/55 |
| 8,274,828 B2 | 9/2012 | Wang et al. | |
| 2002/0005744 A1 | 1/2002 | Forbes | |
| 2007/0205807 A1 * | 9/2007 | Tsuchi et al. | 327/51 |
| 2012/0098690 A1 | 4/2012 | Dinc et al. | |
| 2012/0263223 A1 | 10/2012 | Rajaee et al. | |
| 2013/0009796 A1 | 1/2013 | Sakiyama et al. | |
| 2013/0257483 A1 | 10/2013 | Bulzacchelli | |

FOREIGN PATENT DOCUMENTS

EP    0822477 A2    2/1998

OTHER PUBLICATIONS

International Search Report and Written Opinion—PCT/US2014/062843—ISA/EPO—Jan. 20, 2015.

* cited by examiner

*Primary Examiner* — Sibin Chen
*Assistant Examiner* — Metasebia Retebo
(74) *Attorney, Agent, or Firm* — Fountainhead Law Group P.C.

(57) ABSTRACT

The present disclosure includes circuits and methods for latching signals. In one embodiment, two inverters are configured back to back to latch a signal. Each inverter includes a capacitor configured between control terminals of inverter transistors. In one embodiment, the circuit is part of a comparator. First and second voltages are received on control terminals of differential transistors, and a differential output signal is coupled to two back to back inverters. In one embodiment, a circuit is disabled and a voltage on a control terminal of a transistor in an inverter is set below a reference, such as a power supply, to increase the speed of the circuit.

16 Claims, 4 Drawing Sheets

LATCH COMPARATOR CIRCUITS AND METHODS

BACKGROUND

The present disclosure relates to electronic systems and methods, and in particular, to latching circuits and methods.

A latch is a circuit that typically has two stable states and can be used to capture and store information. Latching information may be implemented in a variety of ways. One example latching circuit is a logic circuit that receives digital signals and is configured to have a bistable output, where the output resolves into one of two stable states. Example logic circuits that are commonly used as latches include inverters, SR latches, JK latches, and D latches (sometimes referred to as "Flip Flops").

Comparator circuits sometimes use latch circuits to capture the result of a comparison operation. Performance of the comparator can become highly dependent on the performance of the latch circuit following a comparison circuit. For example, in high speed analog-to-digital converters ("ADCs") (e.g. SAR, flash ADCs), the overall conversion time of the ADC may depend on the speed of the comparator, which is dependent on the ability of the latch to resolve to a final output. The latency of a latch, in turn, can depend on supply voltage variations. For example, at low supply voltages, the latency of a complementary latch increases due to the reduction of the bias current at low supply voltages, for example. Latches must also be stable over variations in the supply voltage during operation. Thus, as supply voltages decrease, there is a need to find faster circuits for performing the latching function that perform well over variations in the supply voltage.

SUMMARY

The present disclosure includes latching circuits and methods. In one embodiment, the present disclosure includes a circuit comprising a first transistor having a control terminal, a first terminal and a second terminal, a second transistor having a control terminal, a first terminal, and a second terminal, wherein the first terminal of the first transistor is coupled to the first terminal of the second transistor, a first inverter and a second inverter, wherein an output of the first inverter is coupled to an input of the second inverter and an output of the second inverter is coupled to an input of the first inverter, wherein a bias terminal of the first inverter is coupled to the second terminal of the first transistor and a bias terminal of the second inverter is coupled to the second terminal of the second transistor. The first inverter comprises a third transistor having a control terminal, a first terminal, and a second terminal, a fourth transistor having a control terminal, a first terminal, and a second terminal, and a first capacitor coupled between the control terminal of the third transistor and the control terminal of the fourth transistor. The second inverter comprises a fifth transistor having a control terminal, a first terminal, and a second terminal, a sixth transistor having a control terminal, a first terminal, and a second terminal, and a second capacitor coupled between the control terminal of the fifth transistor and the control terminal of the sixth transistor.

In one embodiment, a voltage on the control terminal of the third transistor is less than a voltage on the control terminal of the fourth transistor and a voltage on the control terminal of the fifth transistor is less than a voltage on the control terminal of the sixth transistor when the first and second inverters are disabled.

In one embodiment, when the first and second inverters are disabled, the first and second terminals of the third, fourth, fifth, and sixth transistors and the control terminals of the fourth and sixth transistors are coupled to a reference voltage, and the control terminals of the third and fifth transistors are coupled to a voltage below the reference voltage.

In one embodiment, when the first and second inverters are disabled, the control terminals of the third and fifth transistors are coupled to an MOS transistor threshold voltage below a supply voltage.

In one embodiment, the circuit further comprises a precharge circuit coupled to the control terminal of the third transistor and the control terminal of the fifth transistor.

In one embodiment, the precharge circuit comprises a seventh transistor having a first terminal coupled to the control terminal of the third transistor and a second terminal, and an eighth transistor having a first terminal coupled to the control terminal of the fifth transistor.

In one embodiment, the second terminal of the seventh transistor and the second terminal of the eighth transistor are coupled to a reference generator.

In one embodiment, the reference generator comprises a ninth transistor having a control terminal coupled to the second terminal of the seventh transistor and the second terminal of the eighth transistor, and wherein the ninth transistor further comprises a first terminal coupled to a reference voltage and a second terminal coupled to the control terminal of the ninth transistor and to a load.

In one embodiment, the precharge circuit comprises a first resistor having a first terminal coupled to the control terminal of the third transistor and a second terminal coupled to a reference generator, and a second resistor having a first terminal coupled to the control terminal of the fifth transistor and a second terminal coupled to the reference generator.

In one embodiment, the reference generator comprises a ninth transistor having a control terminal coupled to the second terminal of the first resistor and the second terminal of the second resistor, and wherein the ninth transistor further comprises a first terminal coupled to a reference voltage and a second terminal coupled to the control terminal of the ninth transistor and to a load.

In another embodiment, the techniques described below include a method. In one embodiment, the method comprises receiving a first input voltage on a control terminal of a first transistor, the first transistor having a first terminal and a second terminal, receiving a second input voltage on a control terminal of a second transistor, the second transistor having a first terminal and a second terminal, wherein the first terminal of the second transistor is coupled to the first terminal of the first transistor and selectively coupled to a first reference voltage, coupling a first component of a differential signal from the second terminal of the first transistor to a bias terminal of a first inverter, coupling a second component of the differential signal from the second terminal of the second transistor to a bias terminal of a second inverter, wherein an output of the first inverter is coupled to an input of the second inverter and an output of the second inverter is coupled to an input of the first inverter, coupling an output signal from the output of the second inverter to a control terminal of a fourth transistor and a first terminal of a first capacitor at the input of the first inverter and coupling the output signal through the first capacitor to a control terminal of a third transistor, and coupling an output signal from the output of the first inverter to a control terminal of a sixth transistor and a first terminal of a second capacitor at the input of the second inverter and coupling the output signal through the second capacitor to a control terminal of a fifth transistor.

In one embodiment, the method further comprises precharging the control terminal of the third transistor and the control terminal of the fifth transistor.

In one embodiment, precharging comprises selectively coupling a second reference voltage through a seventh transistor having a first terminal coupled to the control terminal of the third transistor and an eighth transistor having a first terminal coupled to the control terminal of the fifth transistor.

In one embodiment, the method further comprises generating the second reference voltage in a ninth transistor having a first terminal coupled to a third reference voltage and a second terminal coupled to the control terminal of the ninth transistor and to a load.

In one embodiment, precharging comprises coupling a second reference voltage through a first resistor having a first terminal coupled to the control terminal of the third transistor and a second resistor having a first terminal coupled to the control terminal of the fifth transistor.

In one embodiment, the method further comprises generating the second reference voltage in a ninth transistor having a first terminal coupled to a third reference voltage and a second terminal coupled to the control terminal of the ninth transistor and to a load.

In one embodiment, a voltage on the control terminal of the third transistor is less than a voltage on the control terminal of the fourth transistor and a voltage on the control terminal of the fifth transistor is less than a voltage on the control terminal of the sixth transistor when the first and second inverters are disabled.

In one embodiment, when the first and second inverters are disabled, the first and second terminals of the third, fourth, fifth, and sixth transistors and the control terminals of the fourth and sixth transistors are coupled to a reference voltage, and the control terminals of the third and fifth transistors are coupled to a voltage below the reference voltage.

In one embodiment, when the first and second inverters are disabled, the control terminals of the third and fifth transistors are coupled to an MOS transistor threshold voltage below a supply voltage.

In another embodiment, the present disclosure includes a circuit comprising means for receiving a first voltage and a second voltage and producing a differential signal, a first logic circuit comprising a first pair of transistors configured in series having a first capacitor configured between control terminals of the first pair of transistors, wherein a bias terminal of the first inverter receives a first component of the differential signal, and a second logic circuit comprising a second pair of transistors configured in series having a second capacitor configured between control terminals of the second pair of transistors, wherein a bias terminal of the second inverter receives a second component of the differential signal, where an output of the first logic circuit is coupled to an input of the second logic circuit and an output of the second logic circuit is coupled to an input of the first logic circuit to produce a bi-stable output.

The following detailed description and accompanying drawings provide a better understanding of the nature and advantages of the present disclosure.

DETAILED DESCRIPTION

The present disclosure pertains to latch circuits and latch comparators. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
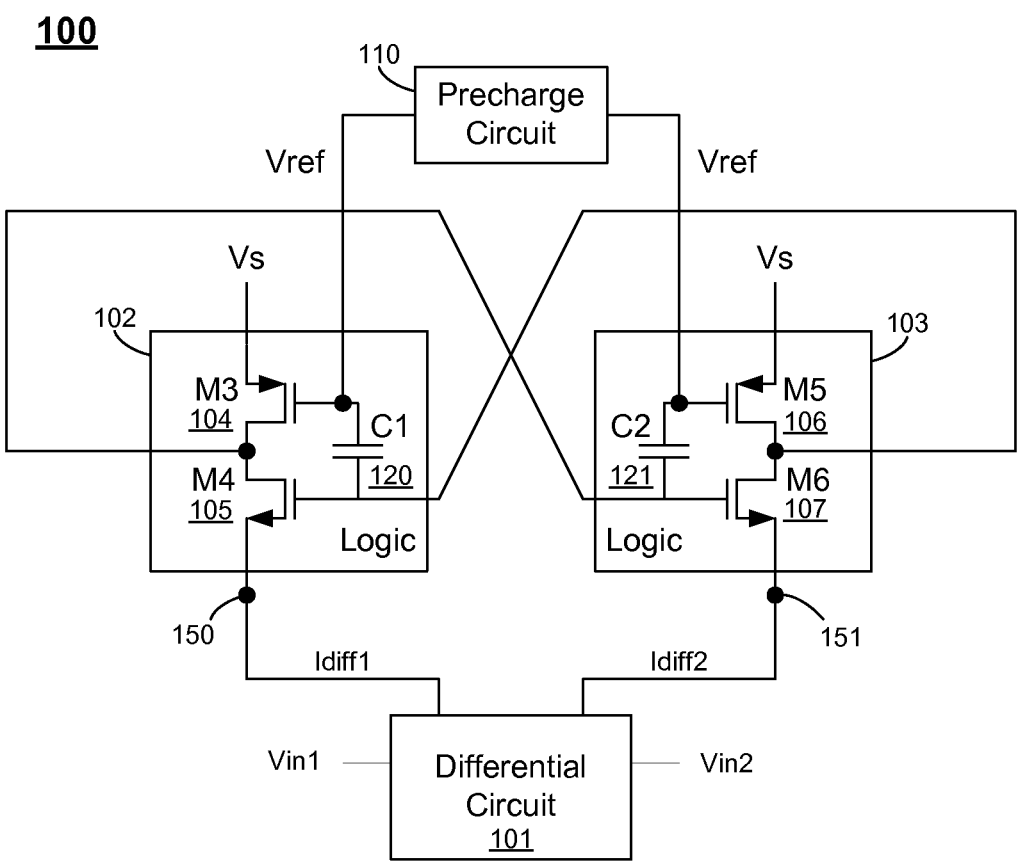
FIG. 1 illustrates an example circuit according to one embodiment.

FIG. 1 illustrates an example latch comparator circuit according to one embodiment. Latch comparator circuit 100 includes a differential circuit 101 and a pair of cross coupled logic circuits 102 and 103 configured to produce a bi-stable output. Differential circuit 101 receives two voltages Vin1 and Vin2 and produces a differential output current signal having components Idiff1 and Idiff2. A first logic circuit 102 has a first bias terminal coupled to supply voltage Vs and a second bias terminal 150 coupled to a first output terminal of differential circuit 101 to receive Idiff1. Similarly, a second logic circuit 103 has a first bias terminal coupled to supply voltage Vs and a second bias terminal 151 coupled to a second output terminal of differential circuit 101 to receive Idiff2. An input of logic circuit 102 is coupled to an output of logic circuit 103, and an input of logic circuit 103 is coupled to an output of logic circuit 102 so that when an output of one logic circuit is high, the other is low.

A voltage difference between Vin1 and Vin2 causes a current difference in Idiff1 and Idiff2. For example, when Vin1 is lower than Vin2, a current from terminal 150 into differential circuit 101 may be lower than a current from terminal 151, which causes the voltage at node 150 to be higher than the voltage at node 151. Similarly, when Vin1 is higher than Vin2, a current from terminal 150 into differential circuit 101 may be higher than a current from terminal 151, and the voltage at node 150 may be lower than the voltage at node 151. When the voltage at node 150 is lower than that voltage at node 151, an output of logic circuit 102 is pulled low and an output of logic circuit 103 is pulled high. The logic circuits stabilize with the output of logic circuit 102 low and the output of logic circuit 103 high. Similarly, when the voltage at node 150 is higher than the voltage at node 151, an output of logic circuit 102 is pulled high and an output of logic circuit 103 is pulled low. The logic circuits will stabilize with the output of logic circuit 102 high and the output of logic circuit 103 low. Thus, voltages Vin1 and Vin2 cause the output of latch comparator circuit 100 to take on one of two states (the output is bi-stable).

While a variety of logic circuits may be used in various embodiments to implement a latch function, the present example illustrates the use of two inverters each comprising pair of transistors configured in series. For instance, logic circuit 102 includes PMOS transistor 104 (M3) and NMOS transistor 105 (M4) configured in series between supply voltage Vs and terminal 150 of differential circuit 101. Likewise, logic circuit 103 includes PMOS transistor 106 (M5) and NMOS transistor 107 (M6) configured in series between supply voltage Vs and another terminal 151 of differential circuit 101. Each transistor includes a control terminal (e.g., a gate) and first and second terminals (e.g., sources and drains) configured as shown.

Features and advantages of the present disclosure include configuring a capacitor between control terminals of transistors in each logic circuit. For example, capacitor 120 (C1) is configured between the control terminals of transistors 104 and 105. Similarly, capacitor 121 (C2) is configured between the control terminals of transistors 106 and 107. In one embodiment, the circuit is configured so that voltages on the control terminals of transistors 104 and 106 may be less than voltages on the control terminal of transistors 105 and 107 during particular points of operation to increase the transconductance and speed of the circuitry. Accordingly, one example embodiment includes an AC-coupled regeneration latch that uses ac-coupling to shift a gate voltage of the PMOS complementary devices and allows more current to flow through the regeneration latch to increase the speed of latch at lower supply voltages.

In one embodiment, a circuit according to the present disclosure may include a precharge circuit 110. Precharge circuit 110 may selectively couple a reference voltage, Vref, to the control terminals of transistors 104 and 106 to set a voltage on capacitors C1 and C2 and bias transistors 104 and 106. In one embodiment, latch comparator circuit 100 may be operated in a disabled state and an enabled state. During a disabled state (or setup state), nodes in the circuit may be coupled to particular voltages and the input voltages Vin1 and Vin2 are received. The circuit may then be enabled so that the circuit responds to the input voltages, and the outputs resolve to one of the two stable output states. During the disabled state, the precharge circuit may provide Vref to the control terminals of transistor 104 and 106 to set the bias and improve the speed of the circuit when the circuit transitions to the enabled state. When the circuit is enabled, precharge circuit presents a high impedance, and Vref may be stored on capacitors C1 and C2 to set the bias point on transistors 104 and 106 to increase the transconductance of the circuit, for example.

Figure 2:
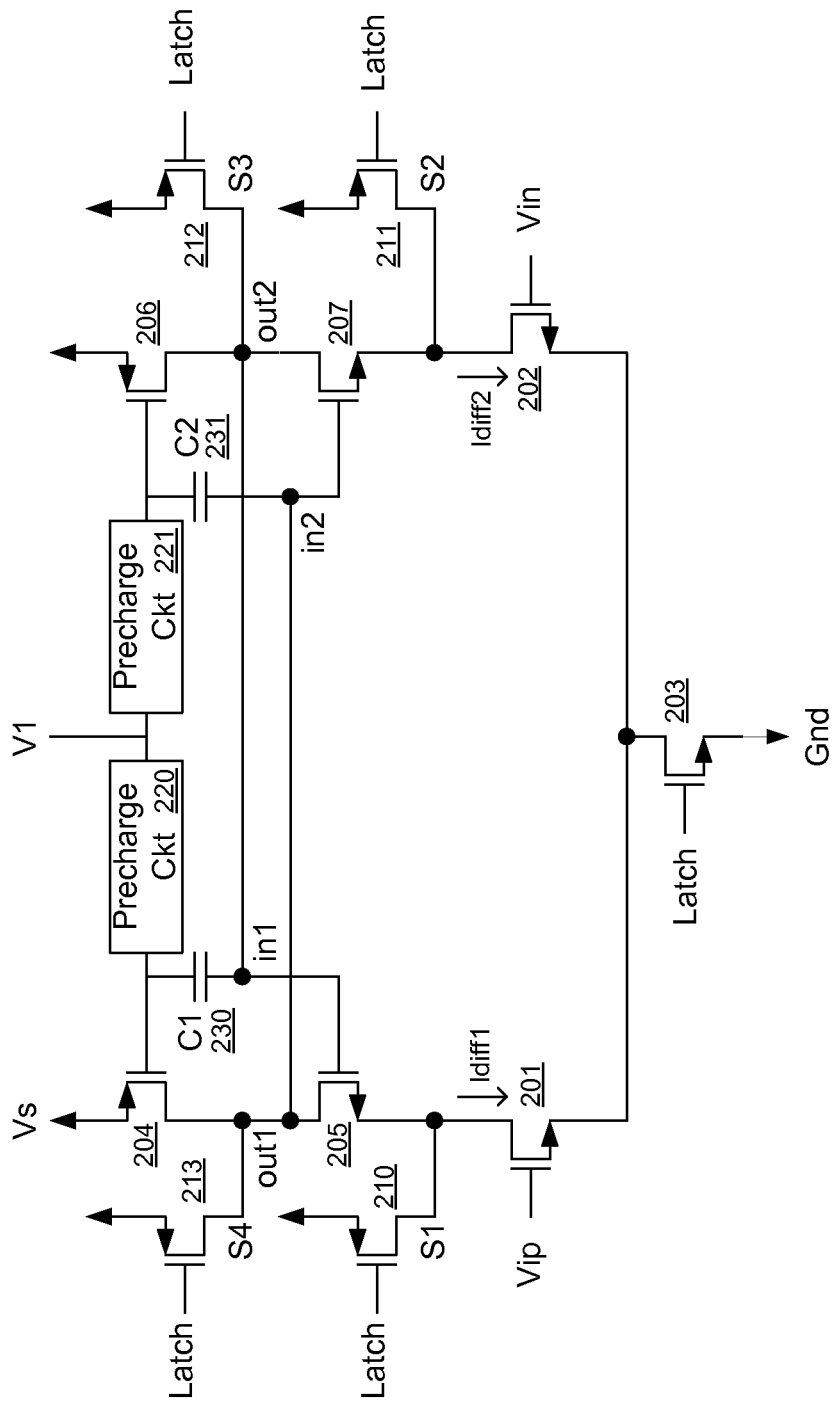
FIG. 2 illustrates an example implementation according to another embodiment.

FIG. 2 illustrates an example implementation of a latch comparator circuit according to another embodiment. Latch comparator circuit 200 includes differentially configured transistors 201 and 201. Transistor 201 receives a first input voltage Vip on a control terminal and produces a first component, Idiff1, of a differential signal. Similarly, transistor 202 receives a first input voltage Vin on a control terminal and produces a second component, Idiff2, of a differential signal. Second terminals of transistors 201 and 202 are coupled together and to a terminal of transistor 203. Transistor 203 receives a "Latch" signal on a control terminal and other terminal of transistor 203 is coupled to a reference voltage, such as ground (GND), to selectively couple the sources of transistors 201 and 202 to ground. Idiff1 and Idiff2 may be differential currents generated by transistors 201 and 202 when the Latch signal is high and transistor 203 is turned on, for example.

The differential currents Idiff1 and Idiff2 flow into a pair of cross-coupled inverters comprising transistors 204-207 and capacitors C1 and C2. An output, out1, of one inverter comprising transistors 204-205 is coupled to the input, in2, of the other inverter comprising transistors 206-207. Similarly, the input, in2, of the inverter comprising transistors 204-205 is coupled to the output, out2, of the inverter comprising transistor 206 and 207. The differential current Idiff1 and Idiff2 are coupled to the sources of transistors 205 and 207, which causes the cross-coupled inverters to assume one of two states when the latch is active. Accordingly, the drain terminals of transistors 204 and 205 either go high or low (depending on Vip and Vin) and the drain terminals of 206 and 207 go low or high (the opposite of the drains of transistor 206 and 207).

During a first time period (e.g., a disable state), the Latch signal is low and the nodes in the circuit are set to a reference voltage (Vs) by switches S1-S4. During this time period, transistor 203 is turned off and the source terminals of transistors 201 and 202 are floating. When the Latch signal goes high (e.g., an enable state), transistor 203 turns on, switches S1-S4 open, and the differential transistor pair resolves the difference between Vip and Vin and drives the cross-coupled inverters into one of two states.

The latch comparator circuit 200 includes a pair of precharge circuits 220 and 221. Each precharge circuit is configured between a reference voltage V1 and a control terminal of a different output transistor 204 and 206 of each inverter. When the Latch signal is low, the precharge circuit sets a voltage on capacitors C1 and C2 to set a bias on the output transistors 204 and 206. For example, when the Latch signal is low, the precharge circuits may set the voltage on the control terminals of transistors 204 and 206 to be equal to V1. When the Latch signal goes high, the precharge circuits may isolate the control terminals of transistors 204 and 206 from V1 so that each capacitor C1 and C2 maintains the voltage V1 when latching the signal from differential transistors 201 and 202. Voltage V1 may be set so that the voltage on the control terminals of transistors 204 and 206 is less than the voltage on the control terminals of transistors 205 and 207. Accordingly, transistors 204 and 206 are more strongly biased at lower power supply voltages, for example, to improve the speed of the latch comparator.

As the latch resolves, the signal at the first inverter output, out1, is coupled to a control terminal of an input transistor 207 in the second inverter and AC coupled through capacitor C2 to the control terminal of the output transistor 206. Similarly, a signal at the second inverter output, out2, is coupled to a control terminal of an input transistor 205 in the first inverter and AC coupled through capacitor C1 to the control terminal of the output transistor 204. The additional signal provided through capacitance C1 and C2 to the gates of transistors 204 and 206 improves the transconductance of each inverter is as follows:

Effective transconductance of inverter 1: $G_{inv1} = G_{m3} + (C_2/(C_2+C_{g5}))G_{m5}$ Effective transconductance of inverter 2: $G_{inv2} = G_{m4} + (C_1/(C_1+C_{g6}))G_{m6}$ Effective capacitance: $C_{o1} = C_{g3} + (C_2/(C_2+C_{g5}))C_{g5} + C_{L1}$ Effective capacitance $C_{o2} = C_{g4} + (C_1/(C_1+C_{g6}))C_{g6} + C_{L2}$.

Figure 3:
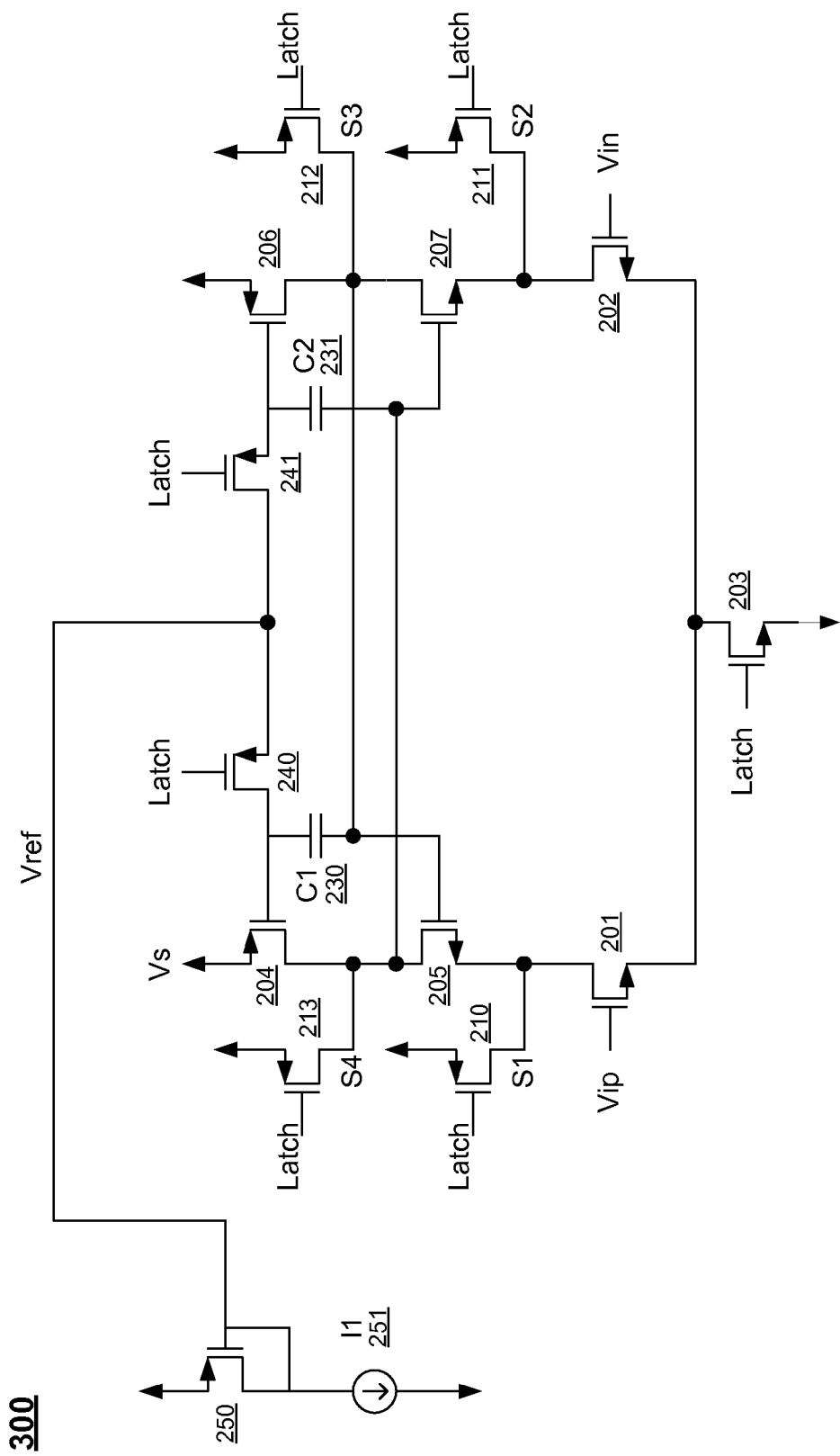
FIG. 3 illustrates one example of a precharge circuit according to one embodiment.

FIG. 3 illustrates an example precharge circuit according to one embodiment. In this example, a precharge circuit comprises PMOS transistor 220 and PMOS transistor 241 configured to receive a reference voltage from a diode configured PMOS transistor 250. Transistor 250 has a first control terminal coupled to a reference voltage, such as Vs, and a second terminal coupled to the gate terminal and to a load (e.g., current source (I1) 251. The gate terminal of transistor 250 produces voltage Vref, which is coupled to terminals of transistors 240 and 241. Accordingly, diode configured PMOS transistor 250 generates Vref, which is an MOS transistor threshold voltage below a supply voltage Vs. In this example, a PMOS transistor threshold voltage may be used to bias PMOS transistors 204 and 206.

During a disabled state, when the Latch signal is low, transistors 240 and 241 are turned on and a voltage Vref is coupled to the gate terminals of transistors 204 and 206. Vref charges capacitors C1 and C2 to set a bias voltage on the gate terminals. When the latch comparator circuit 300 is enabled, the Latch signal voltage goes high and transistors 240 and 241 turn off, which effectively disconnects the gate terminals of transistors 204 and 206 from Vref. At the same time, in this example, switches S1-S4 are opened, transistor 203 is activated, and the latch comparator circuit starts to resolve the input voltages Vip and Vin. The input voltages Vip and Vin propagate to the output faster because of the improved transconductance of transistors 204 and 206 resulting from the bias voltage stored on capacitors C1 and C2.

Figure 4:
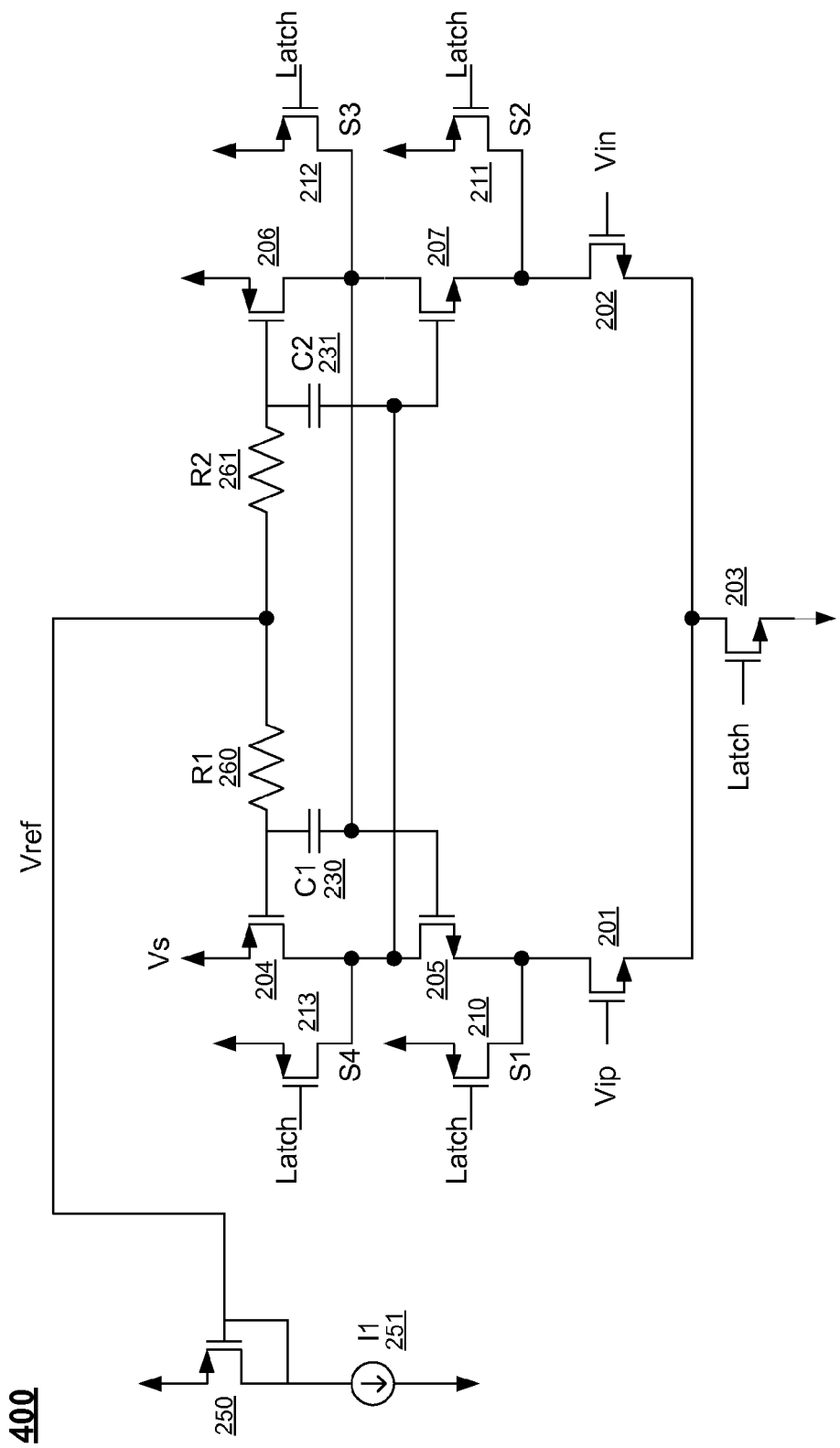
FIG. 4 illustrates another example of a precharge circuit according to another embodiment.

FIG. 4 illustrates another example of a precharge circuit according to another embodiment. In this example, latch comparator circuit 400 includes a precharge circuit comprising resistors (R1) 260 and resistor (R2) 261. A reference voltage Vref is coupled to the gate terminals of PMOS transistors 204 and 206 through resistors 260 and 261 to bias the gate terminals of PMOS transistors 204 and 206 with a PMOS threshold voltage below supply voltage Vs. Accordingly, in a disabled state, a voltage Vref is stored on capacitors C1 and C2. When latch comparator circuit 400 is enabled, resistors 260 and 261 provide isolation from Vref so that transistors 204 and 206 maintain their bias as the inverters of the latch resolve to one of the stable outputs in response to the input voltages Vip and Vin.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
 a first transistor having a control terminal, a first terminal and a second terminal;
 a second transistor having a control terminal, a first terminal, and a second terminal, wherein the first terminal of the first transistor is coupled to the first terminal of the second transistor;
 a first inverter and a second inverter, wherein an output of the first inverter is coupled to an input of the second inverter and an output of the second inverter is coupled to an input of the first inverter, wherein a bias terminal of the first inverter is coupled to the second terminal of the first transistor and a bias terminal of the second inverter is coupled to the second terminal of the second transistor,
 the first inverter comprising:
 a third transistor having a control terminal, a first terminal, and a second terminal;
 a fourth transistor having a control terminal, a first terminal, and a second terminal; and
 a first capacitor coupled between the control terminal of the third transistor and the control terminal of the fourth transistor;
 the second inverter comprising:
 a fifth transistor having a control terminal, a first terminal, and a second terminal;
 a sixth transistor having a control terminal, a first terminal, and a second terminal; and
 a second capacitor coupled between the control terminal of the fifth transistor and the control terminal of the sixth transistor; and
 a precharge circuit coupled to the control terminal of the third transistor and the control terminal of the fifth transistor to produce a first reference voltage to the control terminal of the third transistor and the control terminal of the fifth transistor when the first and second inverters are disabled,
 wherein a voltage on the control terminal of the third transistor is less than a voltage on the control terminal of the fourth transistor and a voltage on the control terminal of the fifth transistor is less than a voltage on the control terminal of the sixth transistor when the first and second inverters are disabled.

2. The circuit of claim 1 wherein, when the first and second inverters are disabled, the first and second terminals of the third, fourth, fifth, and sixth transistors and the control terminals of the fourth and sixth transistors are coupled to a second reference voltage, and the control terminals of the third and fifth transistors are coupled to the first reference voltage, wherein the first reference voltage is below the second reference voltage.

3. The circuit of claim 1 wherein, when the first and second inverters are disabled, the control terminals of the third and fifth transistors are coupled to an MOS transistor threshold voltage below a supply voltage.

4. The circuit of claim 1 wherein the precharge circuit comprises a seventh transistor having a first terminal coupled to the control terminal of the third transistor and a second terminal, and an eighth transistor having a first terminal coupled to the control terminal of the fifth transistor and a second terminal.

5. The circuit of claim 4 wherein the second terminal of the seventh transistor and the second terminal of the eighth transistor are coupled to a reference generator.

6. The circuit of claim 5 wherein the reference generator comprises a ninth transistor having a control terminal coupled to the second terminal of the seventh transistor and the second terminal of the eighth transistor, and wherein the ninth transistor further comprises a first terminal coupled to a reference voltage and a second terminal coupled to the control terminal of the ninth transistor and to a load.

7. The circuit of claim 1 wherein the precharge circuit comprises a first resistor having a first terminal coupled to the control terminal of the third transistor and a second terminal coupled to a reference generator, and a second resistor having a first terminal coupled to the control terminal of the fifth transistor and a second terminal coupled to the reference generator.

8. The circuit of claim 7 wherein the reference generator comprises a ninth transistor having a control terminal coupled to the second terminal of the first resistor and the second terminal of the second resistor, and wherein the ninth transistor further comprises a first terminal coupled to a reference voltage and a second terminal coupled to the control terminal of the ninth transistor and to a load.

9. A method comprising:
 receiving a first input voltage on a control terminal of a first transistor, the first transistor having a first terminal and a second terminal;
 receiving a second input voltage on a control terminal of a second transistor, the second transistor having a first terminal and a second terminal, wherein the first terminal of the second transistor is coupled to the first terminal of the first transistor and selectively coupled to a first reference voltage;
 coupling a first component of a differential signal from the second terminal of the first transistor to a bias terminal of a first inverter;
 coupling a second component of the differential signal from the second terminal of the second transistor to a bias terminal of a second inverter, wherein an output of the first inverter is coupled to an input of the second inverter and an output of the second inverter is coupled to an input of the first inverter;

coupling an output signal from the output of the second inverter to a control terminal of a fourth transistor and a first terminal of a first capacitor at the input of the first inverter and coupling the output signal through the first capacitor to a control terminal of a third transistor;

coupling an output signal from the output of the first inverter to a control terminal of a sixth transistor and a first terminal of a second capacitor at the input of the second inverter and coupling the output signal through the second capacitor to a control terminal of a fifth transistor; and precharging the control terminal of the third transistor and the control terminal of the fifth transistor, wherein precharging comprising coupling a second reference voltage to the control terminal of the third transistor and the control terminal of the fifth transistor when the first and second inverters are disabled, wherein the second reference voltage on the control terminal of the third transistor is less than a voltage on the control terminal of the fourth transistor and the second reference voltage on the control terminal of the fifth transistor is less than a voltage on the control terminal of the sixth transistor when the first and second inverters are disabled.

10. The method of claim 9 wherein precharging comprises selectively coupling the second reference voltage through a seventh transistor having a first terminal coupled to the control terminal of the third transistor and an eighth transistor having a first terminal coupled to the control terminal of the fifth transistor.

11. The method of claim 10 further comprising generating the second reference voltage in a ninth transistor having a first terminal coupled to a third reference voltage and a second terminal coupled to a control terminal of the ninth transistor and to a load.

12. The method of claim 9 wherein precharging comprises coupling the second reference voltage through a first resistor having a first terminal coupled to the control terminal of the third transistor and a second resistor having a first terminal coupled to the control terminal of the fifth transistor.

13. The method of claim 12 further comprising generating the second reference voltage in a ninth transistor having a first terminal coupled to a third reference voltage and a second terminal coupled to the control terminal of the ninth transistor and to a load.

14. The method of claim 9 wherein, when the first and second inverters are disabled, the first and second terminals of the third, fourth, fifth, and sixth transistors and the control terminals of the fourth and sixth transistors are coupled to a third reference voltage, and the control terminals of the third and fifth transistors are coupled to said second reference voltage, wherein the second reference voltage is below the third reference voltage.

15. The method of claim 9 wherein, when the first and second inverters are disabled, the control terminals of the third and fifth transistors are coupled to an MOS transistor threshold voltage below a supply voltage.

16. A circuit comprising:
means for receiving a first voltage and a second voltage and producing a differential signal;
a first logic circuit comprising a first pair of transistors configured in series having a first capacitor configured between control terminals of the first pair of transistors, wherein a bias terminal of the first logic circuit receives a first component of the differential signal; and
a second logic circuit comprising a second pair of transistors configured in series having a second capacitor configured between control terminals of the second pair of transistors, wherein a bias terminal of the second logic circuit receives a second component of the differential signal,
means for precharging a control terminal of a first PMOS transistor of the first pair of transistors in the first logic circuit and a control terminal of a second PMOS transistor of the second pair of transistors in the second logic circuit, wherein the first PMOS transistor comprises a first terminal coupled to a first reference voltage and the second PMOS transistor comprises a first terminal coupled to the first reference voltage, wherein the means for precharging couples a second reference voltage to the control terminal of the first PMOS transistor and the control terminal of the second PMOS transistor when the first and second logic circuits are disabled,
wherein an output of the first logic circuit is coupled to an input of the second logic circuit and an output of the second logic circuit is coupled to an input of the first logic circuit to produce a bi-stable output,
wherein the second reference voltage on the control terminal of the first PMOS transistor in the first logic circuit is less than a voltage on a control terminal of a first NMOS transistor in the first logic circuit and the second reference voltage on the control terminal of a second PMOS transistor in the second logic circuit is less than a voltage on a control terminal of a second NMOS transistor in the second logic circuit when the first and second logic circuits are disabled.

* * * * *